(12) United States Patent
Koo

(10) Patent No.: US 6,862,231 B2
(45) Date of Patent: Mar. 1, 2005

(54) REPAIR CIRCUIT

(75) Inventor: Bon Seong Koo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/635,018

(22) Filed: Jun. 30, 2003

(65) Prior Publication Data
US 2004/0119523 A1 Jun. 24, 2004

(30) Foreign Application Priority Data
Dec. 21, 2002 (KR) ................................ 10-2002-0082034

(51) Int. Cl.[7] ................................................ G11C 7/00
(52) U.S. Cl. .................................... 365/200; 365/225.7
(58) Field of Search ............................... 365/200, 225.7

(56) References Cited

U.S. PATENT DOCUMENTS 5,689,464 A    11/1997  Lee et al.
6,026,037 A     2/2000  Hong
6,191,984 B1 *  2/2001  Noh ........................... 365/200
6,205,064 B1    3/2001  Ooishi
6,504,769 B2    1/2003  Do et al.
2002/0136070 A1 9/2002  Arikl

* cited by examiner

Primary Examiner—Huan Hoang
(74) Attorney, Agent, or Firm—Heller Ehrman White and McAuliffe LLP

(57) ABSTRACT

A repair circuit of a semiconductor memory device features a fuse box unit, a fuse stop unit and a repair control circuit unit. The fuse box unit outputs a first control signal to command a failed cell to be substituted with a spare cell when inputted address information is identical with address information programmed in a fuse. The fuse stop unit outputs a third control signal to command the spare cell to be substituted in response to the first control signal and a second control signal for representing if the spare cell is normal or not. The repair control circuit unit substitutes the failed cell with the spare cell in response to the third control signal. As a result, the repair circuit of the present invention substitutes a failed cell with a normal spare cell when a space cell is normal, without performing a repair operation when a spare cell fails.

10 Claims, 2 Drawing Sheets

REPAIR CIRCUIT

BACKGROUND OF THE INVENTION

1. Field of the Invention

The present invention relates to a repair circuit of a semiconductor memory device, and more specifically, to a repair circuit comprising an additional unit for preventing a repair operation when a spare cell fails.

2. Description of the Related Art

If even one of a large number of microscopic cells in a dynamic random access memory (DRAM) fails, the device cannot be normally operated as a DRAM. It is uneconomic to discard the entire memory device because of only a few number of the failed cells in the DRAM.

In order to solve this problem, a DRAM comprises a repair circuit for substituting failed cells with extra spare cells to have improved yield.

When an address of failed cells is inputted into the DRAM, the repair circuit renders the spare cells accessed instead of the failed cells. As a result, through having some failed cells, the DRAM can perform a normal operation due to the repair circuit.

FIG. 1 is a circuit diagram illustrating a conventional repair circuit of a semiconductor memory device.

The conventional repair circuit comprises a fuse box unit 10 and a repair control circuit 20. The fuse box 10 outputs a control signal for controlling a repair operation. The repair control circuit 20 substitutes the failed cell with a spare cell in response to the control signal outputted from the fuse box 10.

The fuse box unit 10 includes a precharge unit 11, a fuse unit 12, an address signal input unit 13 and a latch unit 14. The fuse unit 12 is cut when excessive current flows, and has a first terminal connected to the precharge unit 11. The address signal input unit 13 is connected to a second terminal of the fuse unit 12. The latch unit 14 connected to the first terminal of the fuse unit 12 stably outputs a programmed signal when a fuse is programmed.

The precharge unit 11 comprising a PMOS transistor PM1 controlled by a precharge signal PCG precharges the first terminal of the fuse unit 12 by using a power voltage.

The fuse unit 12 comprises a plurality of fuses F1~F5 connected in series. If an address of a failed cell is inputted in a memory device, a corresponding fuse of the plurality of fuses F1~F5 is cut. As a result, the fuse unit 12 can prevent the failed cell from being used in read/write oeprantion.

The address signal input unit 13 comprises NMOS transistors NM1~NM5 one-to-one controlled by addresses AD1~AD5.

The latch unit 14 including inverters I1 and I2 connected with a feed-back type latches a potential of a node A, and transmits the latched potential into the repair control circuit 20.

Hereinafter, the operation of the conventional repair circuit is explained.

When a precharge signal PCG having a low level is inputted into a gate of the PMOS transistor PM1 in the precharge unit 11, the PMOS transistor PM1 is driven to apply a voltage VCC to a first terminal of the fuse unit 12. As a result, the first terminal is precharged.

Thereafter, a plurality of address signals AD1~AD5 are inputted into the address signal input unit 13. If the address signals AD1~AD5 are those of a normal cell, the potential of the node A becomes at a low level. When the potential of the node A is at the low level, a potential of a node B becomes at a high level. As a result, the repair control circuit 20 is not driven.

On the other hand, if the address signals AD1~AD5 inputted into the address signal input unit 13 are those of a failed cell, the potential of the node A becomes at a high level. When the potential of the node A is at the high level, the potential of the node B becomes at a low level. As a result, the repair control circuit 20 is driven to substitute the failed cell with a spare cell.

In this way, the conventional repair circuit compares an inputted address with that of a failed cell programmed in a fuse, and substitutes the failed cell with a spare cell when the inputted address is identical with that of the failed cell.

However, when a substituted spare cell fails, the conventional repair circuit re-substitutes a failed cell with the failed spare cell without detecting the failed spare cell.

As a result, the conventional repair circuit continuously substitutes a failed cell not with a new normal spare cell but with a failed spare cell.

SUMMARY OF THE INVENTION

Accordingly, it is an object of the present invention to provide a repair circuit for substituting a failed cell with a normal spare cell. If a spare cell to be used for repairing the failed cell also fails, address information of a usable spare cell is programmed in a new fuse box. As a result, a failed cell is substituted with a normal spare cell, thereby normally operating the semiconductor memory device.

The repair circuit of a semiconductor memory device comprises a fuse box unit, a fuse stop unit and a repair control circuit unit. The fuse box unit outputs a first control signal to command a failed cell to be substituted with a spare cell when inputted address information is identical with address information programmed in a fuse. The fuse stop unit outputs a third control signal to command the spare cell to be substituted in response to the first control signal and a second control signal representing if the spare cell is normal or not. The repair control circuit unit substitutes the failed cell with the spare cell in response to the third control signal.

DETAILED DESCRIPTION OF THE PREFERRED EMBODIMENTS

The present invention will be described in detail with reference to the attached drawings.

Figure 1:
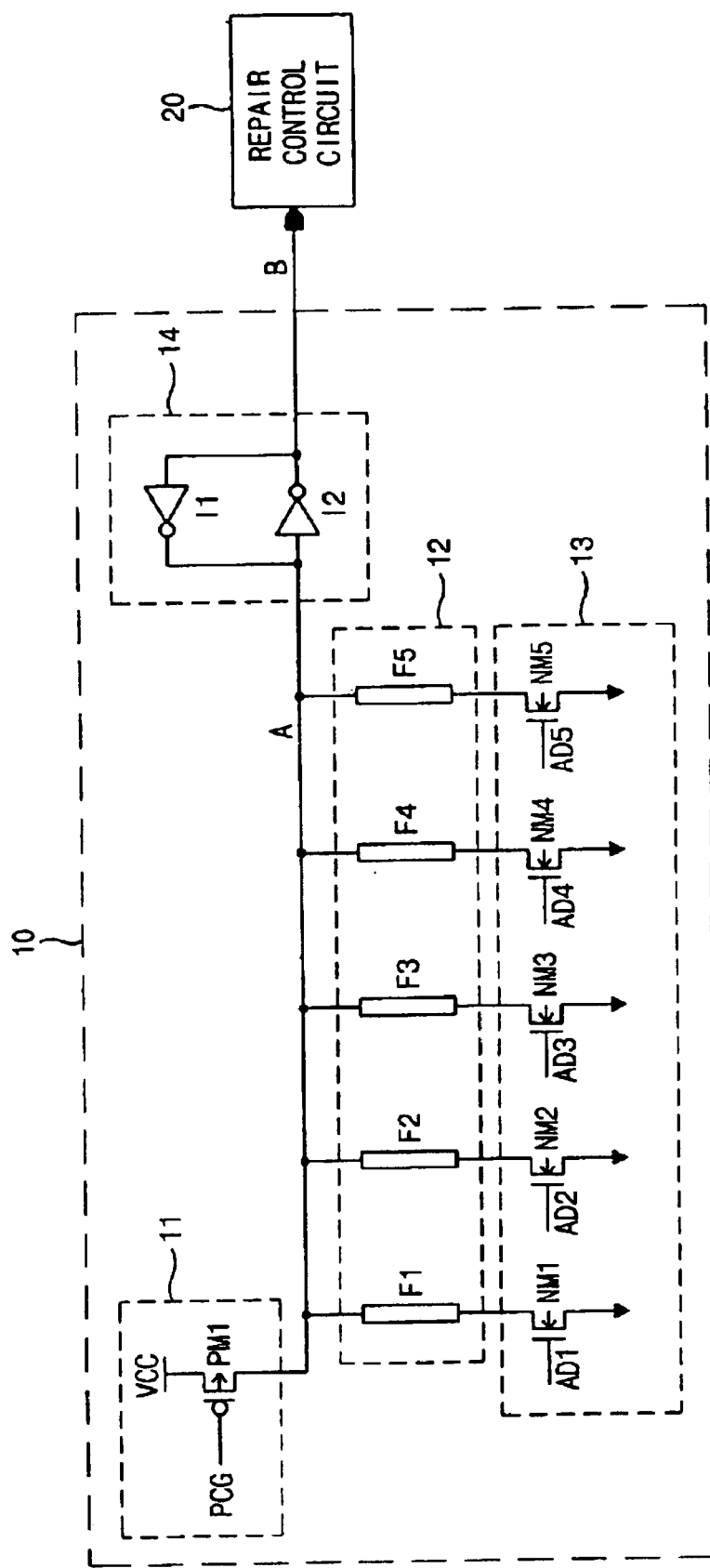
FIG. 1 is a circuit diagram illustrating a conventional repair circuit of a semiconductor memory device.
Figure 2:
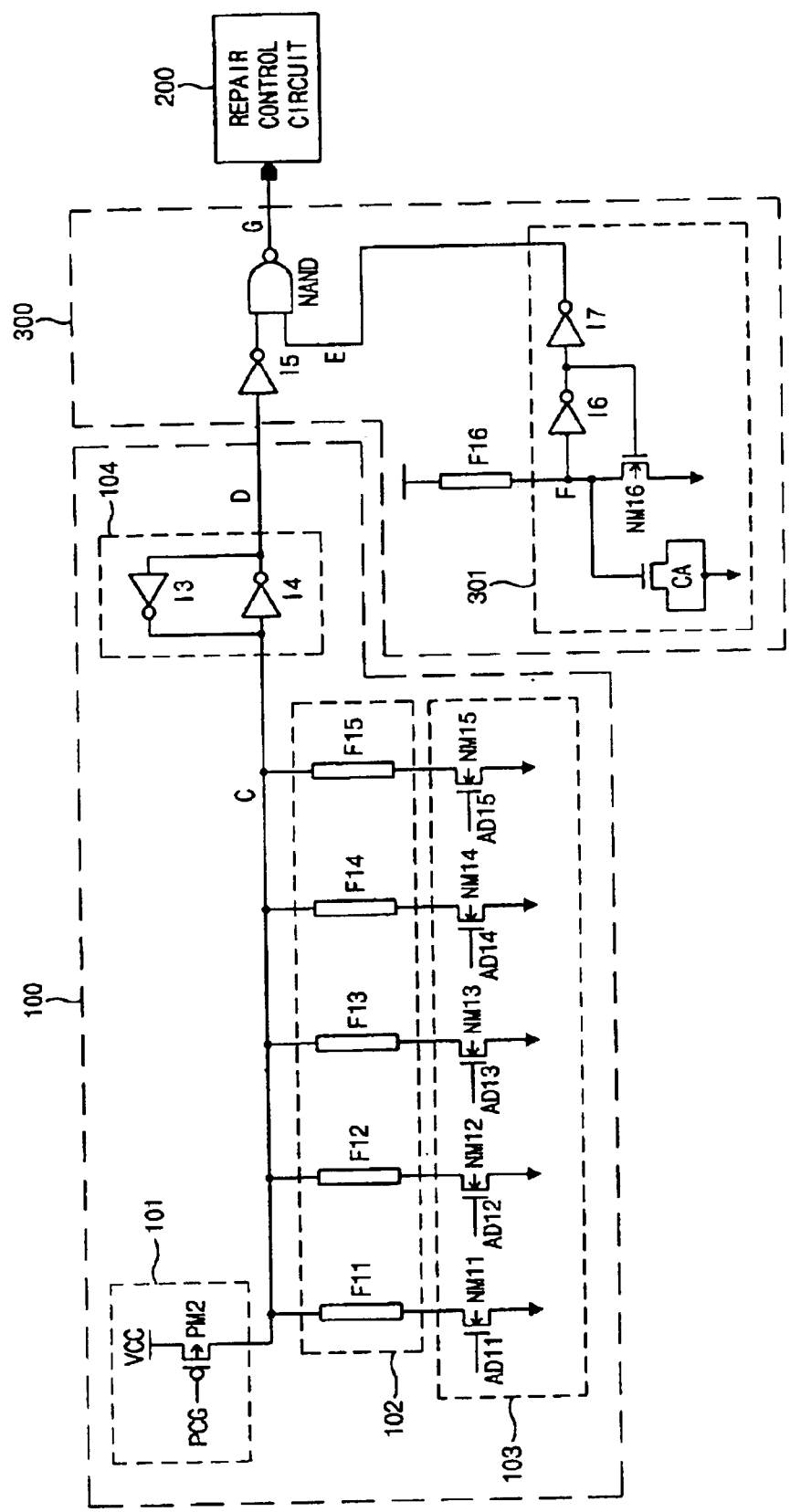
FIG. 2 is a circuit diagram illustrating a repair circuit of a semiconductor memory device according to the present invention.

FIG. 2 is a circuit diagram illustrating a repair circuit of a semiconductor memory device according to the present invention.

The repair circuit of the present invention comprises a fuse box 100, a repair control circuit 200 and a fuse stop unit 300. The fuse box 100 commands a failed cell to be substituted with a spare cell when inputted address information is identical with address information programmed in a fuse. The fuse stop unit 300 outputs a control signal for controlling the repair operation of a failed spare cell depending on the state of the spare cell. The repair control circuit 200 substitutes a failed cell with a normal spare cell in response to the control signal outputted from the fuse stop unit 300.

The fuse box 100 comprises a precharge unit 101, a fuse unit 102, an address signal input unit 103 and a latch unit 104. The fuse unit 102 having a first terminal connected to the precharge unit 101 is cut when excessive current flows. The address signal input unit 103 connected to a second terminal of the fuse unit 102 receives an address signal. The latch unit 104 connected to the first terminal of the fuse unit 102 latches an output signal from the fuse unit 102 and outputs the latched output signal.

The precharge unit 101 comprises a PMOS transistor PM2 controlled by a precharge signal PCG. The precharge unit 101 precharges the first terminal of the fuse unit 102 by using a power voltage VCC.

The fuse unit 102 comprises a plurality of fuses F11~F15 connected in parallel. The fuse unit 102 programs addresses of failed cells obtained during a test on a plurality of cells after a wafer process. When an address inputted into the address signal input unit 103 is identical with the programmed address, a potential of a node C becomes at a high level.

The address signal input unit 103 comprises NMOS transistors NM11~NM15 controlled one-to-one by a plurality of addresses AD11~AD15. Each NMOS transistor NM11~NM15 has a drain connected to each fuse F11~F15 and a source connected to a ground terminal.

The latch unit 104 comprises inverters I3 and I4 connected with a feed-back type. The latch unit 104 stably outputs the potential of the node C.

The fuse stop unit 300 comprises an inverter I5, a fuse F16, an output maintaining unit 301 and a NAND gate NAND. The inverter I5 inverts a potential of a node D. The fuse F16 is cut when a spare cell fails. The output maintaining unit 301 maintains an output signal from the fuse F16 at a predetermined level. The NAND gate NAND performs a NAND operation on output signals from the output maintaining unit 301 and the inverter I5.

The fuse F16 forms a current path if a spare cell is normal. As a result, a potential of a node F becomes at a high level. However, the fuse F16 is cut when the spare cell fails, and the potential of the node F becomes at a low level.

The output maintaining unit 301 comprises inverters I6 and I7, a NMOS transistor NM16 and a capacitor CA. The inverters I6 and I7 connected in series between the node F and the NAND gate NAND maintains the potentials of the nodes E and F at the same level. The NMOS transistor NM16 having a drain connected to the node F and a source connected to ground maintains the potential of node F at a predetermined level in response to an output signal from the inverter I6. The capacitor CA has a first terminal connected to the drain of the NMOS transistor NM16, and a second terminal connected to ground.

If the spare cell is normal, the fuse F16 forms the current path, and the potential of the node F becomes at the high level. As a result, a potential of a node E also becomes at a high level.

However, if the spare cell fails, the fuse F16 is cut, and the potential of the node F becomes at the low level. As a result, the potential of the node E also becomes at a low level.

The NAND gate NAND performs a NAND operation on the potential of the node E and the output signal from the inverter I5, and outputs a control signal for controlling the operation of the repair control circuit.

The repair control circuit 200 operates if a potential of a node G is at a low level while not operating if it is at a high level. In response to an output signal from the fuse stop unit 300, the repair control circuit 200 substitutes the failed cell with the spare cell when the spare cell is normal. However, the repair control circuit 200 does not perform a repair operation when the spare cell fails.

Hereinafter, the operation of the repair circuit of the present invention is described.

First, the operation of the fuse box 100 is explained below.

If a precharge signal PCG having a low level is inputted into a gate of the PMOS transistor PM2 in the precharge unit 101, the PMOS transistor PM2 is turned on to apply the power voltage VCC to the fuse unit 102. As a result, the node C is precharged.

Thereafter, the address signals AD11~AD15 are inputted into the address signal input unit 103. If the address signals AD11~AD15 are those of a normal cell, the NMOS transistors NM11~NM15 are turned on. As a result, each current path is formed with each fuse F11~F15 of the fuse unit 102.

On the other hand, if one of the address signals AD11~AD15 is that of a failed cell, one of the NMOS transistors NM11~NM15 which receives the address signal of the failed cell is turn off, and a corresponding fuse is cut. Thus, the potential of the node C is at a low level if an address signal of a normal cell is inputted while being at a high level if that of a failed cell is inputted.

The latch unit 104 stably outputs the potential of the node C. The potential of the node D is at a high level if the potential of the node C is at the low level while being at a low level if it is at the high level.

Next, the operation of the fuse stop unit 300 is described below.

If a spare cell is normal, the fuse F16 forms a current path, and the potential of the node F becomes at the high level. However, if a spare cell fails, the fuse F16 is cut, and the potential of the node F becomes at the low level. As a result, the potential of the node E becomes at the high level if the potential of the node F is at the high level while the potential of the node E becomes at the low level if the potential of the node F is at the low level.

The NAND gate NAND performs a NAND operation on the potentials of the node D and the node E, and outputs a control signal for controlling the repair operation.

TABLE 1

Truth table on operation of NAND gate NAND

| Node D | State of memory cell | Node E | State of spare cell | Node G | Operation of repair control circuit |
|---|---|---|---|---|---|
| 0 | Failed | 1 | Normal | 0 | ○ |
| 0 | Failed | 0 | Failed | 1 | X |
| 1 | Normal | 1 | Normal | 1 | X |
| 1 | Normal | 0 | Failed | 1 | X |

The operation of the NAND gate NAND is described in detail by referring to Table 1.

As shown in Table 1, the repair control circuit does not operated because the potential of the node E is at the low level if a spare cell fails. However, the repair control circuit operates depending on the state of the memory cell because the potential of the node E is at the high level if a spare cell is normal.

In other words, the fuse stop unit 300 transmits the output signal from the fuse box 100 into the repair control circuit 200 if a spare cell is normal. As a result, the repair operation is not performed if a corresponding memory cell is normal. If a corresponding memory cell fails, the repair control circuit 200 substitutes a corresponding failed cell with a spare cell. On the other hand, if a spare cell fails, the fuse stop unit 300 controls the repair control circuit 200 not to operate regardless of the output signal of the fuse box 100.

In this way, the repair control circuit 200 is not operated when a spare cell fails, and address information on the failed spare cell is inputted in a usable fuse box.

Thereafter, if an address is externally inputted, the externally inputted address is compared with the address information on the failed spare cell inputted in the fuse box. As a result, if the address information is identical, the repair control circuit 200 substitutes a failed spare cell with a new normal spare cell, thereby normally operating the semiconductor memory device.

As discussed earlier, when a spare cell fails, a repair circuit of the present invention substitutes a failed cell not with the failed spare cell but with a normal cell, thereby improving yield of a semiconductor memory device.

What is claimed is:

1. A repair circuit, comprising:
    a plurality of fuse box units for outputting a first control signal to command a failed cell to be substituted with a spare cell when inputted a plurality of address information is identical with address information programmed in a plurality of fuses;
    a plurality of fuse stop units, corresponding one by one to the plurality of fuse box units, for outputting a third control signal determine whether the failed cell is substituted with the spare cell in response to the first control signal and a second control signal representing if the spare cell is normal or not; and
    a repair control circuit unit configured to substitute the failed cell with the spare cell in response to the third control signal.

2. The repair circuit of claim 1, wherein the plurality of fuse stop units comprise:
    a fuse means for cutting a fuse depending on the state of the spare cell, and to output the second control signal; and
    a logic operation means for logically operating the first control sign and the second control signal, and to output the third control signal.

3. The circuit of claim 2, wherein the fuse means further comprises an output maintaining means for maintaining an output signal at a predetermined level.

4. The circuit of claim 3, wherein the output maintaining means further comprises a capacitor connected between the output terminal of the fuse means and a ground terminal.

5. The circuit of claim 3, wherein the output maintaining means comprises:
    an inverter means, connected to an output terminal of the fuse means, for inverting an output signal of the fuse; and
    an NMOS transistor, connected to an output terminal of the inverter means, for being controlled by an output signal of the inverter means.

6. The circuit of claim 5, wherein the output maintaining means further comprises a capacitor connected between the output terminal of the means and a ground terminal.

7. The circuit of claim 1, wherein the repair control circuit does not operate when the third control signal is at a high level, and operates when the third control signal is at a low level.

8. The circuit of claim 1, wherein the plurality of fuse box units comprise:
    an address input unit for receiving the plurality of addresses externally;
    a fuse unit including the plurality of fuses connected in parallel, wherein each fuse is connected to a first terminal of the address input unit, and a predetermined number of fuses are cut when an address of a failed cell is inputted;
    a precharge unit for precharging an output terminal of the fuse unit in response to a precharge signal; and
    a latch unit for latching an output signal of the fuse unit and output the latched output signal.

9. The circuit of claim 8, wherein the precharge unit comprises a PMOS transistor configured to have a source connected to a power voltage and a drain connected to the fuse unit, and to be controlled by the precharge signal.

10. The circuit of claim 8, wherein the address input unit comprises a plurality of transistors connected in parallel, each transistor having a source connected to ground and a drain connected to the plurality of fuses.

* * * * *